United States Patent [19]

Eilenberg et al.

[11] 4,133,376

[45] Jan. 9, 1979

[54] ADVANCED CRYOGENIC MULTI-STAGED RADIATOR SYSTEM

[75] Inventors: Stanton L. Eilenberg, Irvine; Melvin Feiner, Huntington Beach; Charles L. Shuford, Palos Verdes; David W. Triplett, Seal Beach, all of Calif.

[73] Assignee: Rockwell International Corporation, El Segundo, Calif.

[21] Appl. No.: 802,154

[22] Filed: May 31, 1977

[51] Int. Cl.² ............................................. F28F 13/00
[52] U.S. Cl. ............................ 165/105; 165/DIG. 6; 165/135; 62/467 R; 244/158
[58] Field of Search ................. 165/105, DIG. 6, 135; 62/467; 244/158

[56] References Cited

U.S. PATENT DOCUMENTS

| | | | |
|---|---|---|---|
| 3,378,449 | 4/1968 | Roberts et al. | 244/158 X |
| 3,422,886 | 1/1969 | Buller | 62/467 X |
| 3,672,443 | 6/1972 | Bienert et al. | 165/105 X |
| 3,749,156 | 7/1973 | Eby et al. | 165/105 X |
| 4,030,316 | 6/1977 | Aronson | 62/467 R |

*Primary Examiner*—Albert W. Davis, Jr.

[57] ABSTRACT

A passive cooling device especially suitable for application where unattended high performance is required for long periods, such as with space satellite sensors, optics and electronic systems, contains multiple stages of heat radiators insulated from each other and from the supporting structure, with heat pipes thermally attached to some or all of the stages of the radiators to transport heat from the heat producing sources. The multi-stage radiator system utilizes intermediate radiator stages to intercept heat loads conducted through the insulation and supports in order to reduce such conductive loads on the outermost stage and to permit that stage to reject substantial heat loads at extremely low temperatures. These intermediate stages can also provide efficient thermal rejection at the different temperature levels of various elements to be cooled. Heat pipes of various characteristics such as the variable conductance and diode types can be used individually or in thermal combination to suit the needs and constraints of the space systems applications.

8 Claims, 4 Drawing Figures

ADVANCED CRYOGENIC MULTI-STAGED RADIATOR SYSTEM

BACKGROUND OF THE INVENTION

The invention is in the field of passive cooling devices capable of maintaining temperatures in the cryogenic range in sensing, optical and electronic devices, especially in space applications, in order to obtain optimum performance.

As the mechanical problems of delivery of equipment into space have been solved and such delivery has become more or less routine, space satellites and space vehicles have become increasingly more important as platforms for devices to accumulate and advance our knowledge of the earth, other planets, and astronomical phenomena. Such devices have become more and more complex and characteristically operate most efficiently at cryogenic temperatures. Maintenance of such temperatures has been difficult, especially in low earth orbit. Conventional cooling devices with mechanically active thermodynamic cycles are efficient but expensive, and unreliable over long periods of time. In addition they exact a heavy penalty in weight and reduce the usable payload of the launch vehicle.

Other cooling devices include solid cryogens, heat pipes and simple staged radiators. Solid cryogens, though effective, are difficult to contain and have limited operational life since they expend themselves by sublimation and evaporation into space. Heat pipes are useful as a heat transport means from remote locations but are only as effective as the means of dissipation of the transported heat at the heat rejection end of the heat pipe. Radiators have been used for this purpose but have normally been single-stage and subject to inefficiency as a result of the heat of the space vehicle transported by conductance through radiator insulation and supports structure. Staged radiators have appeared in the prior art but in all cases have either been in direct contact with the heat producing source or were primarily shields and secondarily radiators.

Ideally, a radiator should be totally, thermally isolated from the spacecraft structure. This is generally impractical, considering the constraints of the spacecraft launch envelope and the means to extend or provide the radiator with the proper orientation to avoid seeing the sun in certain phases of the orbit. Although insulation materials are constantly being improved, the minimum structure required for support, shielding and control will continue to introduce unwanted heating and thereby limit radiator efficiency.

Even where two separate radiators have been used to avoid the necessity for excessive shielding and to assure that one is always oriented away from the sun, the conductive heat load has been a significant factor in limiting the attainable low temperature. The weight of a second radiator and the associated means to support it, together with the complexity of providing controllable dual connections to the sensor, have been further penalties which make it an undesirable solution.

SUMMARY OF THE INVENTION

In accordance with one embodiment of the present invention, multiple stages of radiators, insulated from each other and from the supporting structure and from any necessary shielding, are connected by heat pipes of various characteristics to such structure and shielding and to sensors or other operating devices requiring temperatures in the cryogenic range for efficient operation. Heat from the structure and shielding is intercepted and rejected by intermediate stages in order to provide a final radiator stage capable of maintaining extremely low temperatures unaffected by unwanted heat loading. The intermediate stages may also be connected to sensors or other operating devices not requiring the heat rejection temperature of the coldest stage.

It is an object of the invention to selectively dissipate heat at different temperatures.

It is a further object of the present invention to provide a minimum weight radiator system capable of dissipating unwanted heat loads selectively and thereby to attain in its coldest stage the maximum cryogenic heat rejection rate.

It is yet another object of the invention to provide such a radiator system in a passive configuration capable of highly reliable, long term, unattended performance.

DESCRIPTION OF THE PREFERRED EMBODIMENT

Figure 1:
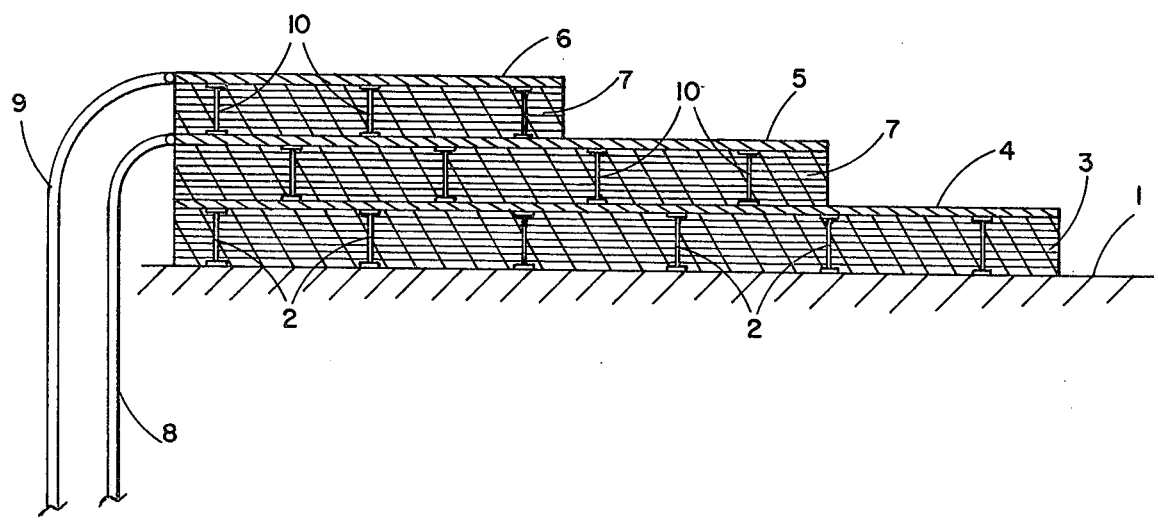
FIG. 1 is a simplified cross-sectional view of the preferred embodiment of the invention.

Referring now to FIG. 1 the invention is presented in its preferred form, omitting such details as fasteners, adhesives and coatings. These will vary from one application to another dependent upon the required size of the radiator system, the nature of the intended spacecraft mission, the physical characteristics of the spacecraft itself, the payload weight limits of the launch vehicle and the like.

Numeral 1 represents the spacecraft boundary such as the spacecraft outer surface, a sun shield outer surface or an extensible holding element. Similarly, supports 2 and 10 are shown representatively only to provide a means of attachment of the system to the spacecraft boundary 1 and means of providing the necessary spaced-apart relationship between boundary 1 and radiator 4 and between successive radiators 4 and 5 and 5 and 6. Such supports may be brackets, piano wire or specially constructed fasteners, preferably of a non-thermally conductive material to mimimize the conductive transfer of parasitic heat from boundary 1 to radiator 4 and between successive radiators 4, 5 and 6. They will normally be staggered between stages to reduce the potential for straight-through heat transfer by conductance. Supports 2 and 10 may be of the same type or different, depending again upon structural requirement, and a skilled designer will select suitable means for each, considering trade-offs in weight, rigidity, and mechanics of launch and orbit.

Radiators 4, 5 and 6 are thermally isolated from each other by means of insulation 7 which is in physical contact throughout its surface area with the radiator surfaces and held in place adhesively or mechanically by supports 10. Insulation 7 may be of any suitable material such as felt, glass fiber, multi-layer blankets or the like.

Multilayer insulation is preferred and consists of many stacked layers of highly reflective radiation shields. Insulated blankets are laid up with the shields oriented perpendicular to the flow of heat. Each reflective layer is a thin (approximately ¼ mil) polymeric film which is metalized on one or both sides, enabling the layer to reflect a large percentage of the radiation it receives. The shields are separated either by nonconductive spacers or by crinkling or embossing to reduce the conductive heat transfer from shield to shield. The use of an embossment pattern rather than spacers gives the insulation a high degree of compressibility with a low spring rate and allows the insulation to be folded and stowed in a compressed condition and deployed in orbit. The gas in the space between the shields is evacuated or vented to space to eliminate gas thermal transfer via convection and conduction.

Insulation 3 may be of the same kind as insulation 7, as when the radiator system is set into a sun shield or attached to an extensible boom or other deployment mechanism, or it may be the spacecraft heat shield or outer insulation itself. Preferably, however, it will be of the multilayer type for most effective performance.

The insulation blankets are arranged so as to completely cover the bottom of each radiator stage and to leave exposed to the heat sink of space a portion of the outboard surfaces of radiators 4 and 5. The outboard surface of radiator 6, being the most outboard, is exposed to space in its entirety.

Radiators 4, 5 and 6 can be of any size, shape or surface finish depending upon the level of heat rejection desired and limitations of the spacecraft, launch vehicle structure or projected orbit. Normally they will be thin flat metallic sheets such as aluminum with an applied organic or inorganic coating with high emittance characteristics. Table 1 lists Applicants' findings on several possible radiator coating systems.

While radiator geometry can be determined for each application by one skilled in the art, Applicants have found that optimum geometry for a given temperature is generally independent of the magnitude of the heat load. Hence, the results can be scaled up or down for any system. The addition of a heat load to the intermediate stage does not significantly affect cold stage heat rejection for heat loads up to ten times the cold stage load. Results of analysis show that optimum radiator geometry is significantly different at cryogenic temperature than at ambient temperature. For example, below 50°K optimum thickness for an aluminum radiator is less than one mil.

TABLE 1

Low Temperature Hemispherical Emittance Several Coating Systems

| Coating System Description | Coating Thickness | Total Hemispherical Emittance | | |
|---|---|---|---|---|
| | | At −220 F | At −100 F | At 0 F |
| Fuller O'Brien No. 162-W-59 White Epoxy-polyamide primer | 0.7-mils | 0.76 | 0.81 | 0.84 |
| | 1.4-mils | 0.77 | 0.83 | 0.87 |
| 3M No. 401A10 Nextel Velvet White Polyester paint. Topcoating applied over Fuller O'Brien No. 162-W-59 primer | 2.3-mils (1.4-mil topcoating over 0.9-mil primer) | 0.90 | 0.92 | 0.95 |
| | 5.8-mils (5.1-mil topcoating over 0.7-mil primer) | 0.95 | 0.97 | 0.97 |
| FEP Type A Teflon film with vacuum-deposited aluminum applied to back surface only and 3M No.467 adhesive applied to aluminized surface | 4-mils (2-mils aluminized Teflon plus 2-mils adhesive) | 0.47 | 0.60 | 0.67 |
| | 7-mils (5-mils aluminized Teflon plus 2-mils adhesive) | 0.66 | 0.73 | 0.81 |
| J.P.Stevens Style No.581 Woven quartz fabric, heat-cleaned at 1000 F for 4 hours, and bonded to substrate with Emerson and Cuming Stycast 2850FT epoxy resin | 13-mils (11-mils woven quartz fabric plus 2-mils epoxy resin adhesive) | 0.89 | 0.88 | 0.91 |

Heat pipes 8 and 9 are shown in thermal contact with radiators 5 and 6 respectively. Since heat pipes are well known in the art and included in the invention in combination only, their principles of operation will not be detailed herein.

Although heat pipe design procedures vary with application, the methodology generally consists of selecting a work fluid for the required operating temperature, based on its physical and thermodynamic properties, and then defining a wick and container that meet the specified performance and pressure containment requirements. Optimization generally involves either maximizing transport capability within a fixed physical envelope or minimizing the size and/or weight for a fixed transport and heat containment requirement. The selection of a cryogenic working fluid is generally determined by the operating temperature range, thermal performance and pressure containment requirements. Table 2 shows the probable temperature ranges of several candidate cryogenic working fluids.

TABLE 2

| Candidate Heat Pipe Working Fluids | |
|---|---|
| Fluid | Temperature Range ° K |
| Hydrogen ($H_2$) | 15 – 30 |
| Neon (Ne) | 25 – 40 |
| Nitrogen ($N_2$) | 60 – 120 |
| Oxygen ($O_2$) | 60 – 140 |
| Argon (Ar) | 90 – 140 |
| Methane ($CH_4$) | 90 – 180 |
| Ethane ($C_2H_6$) | 90 – 200 |
| Freon 14 | 95 – 200 |
| Ethylene ($C_2H_4$) | 110 – 260 |

Figure 4:
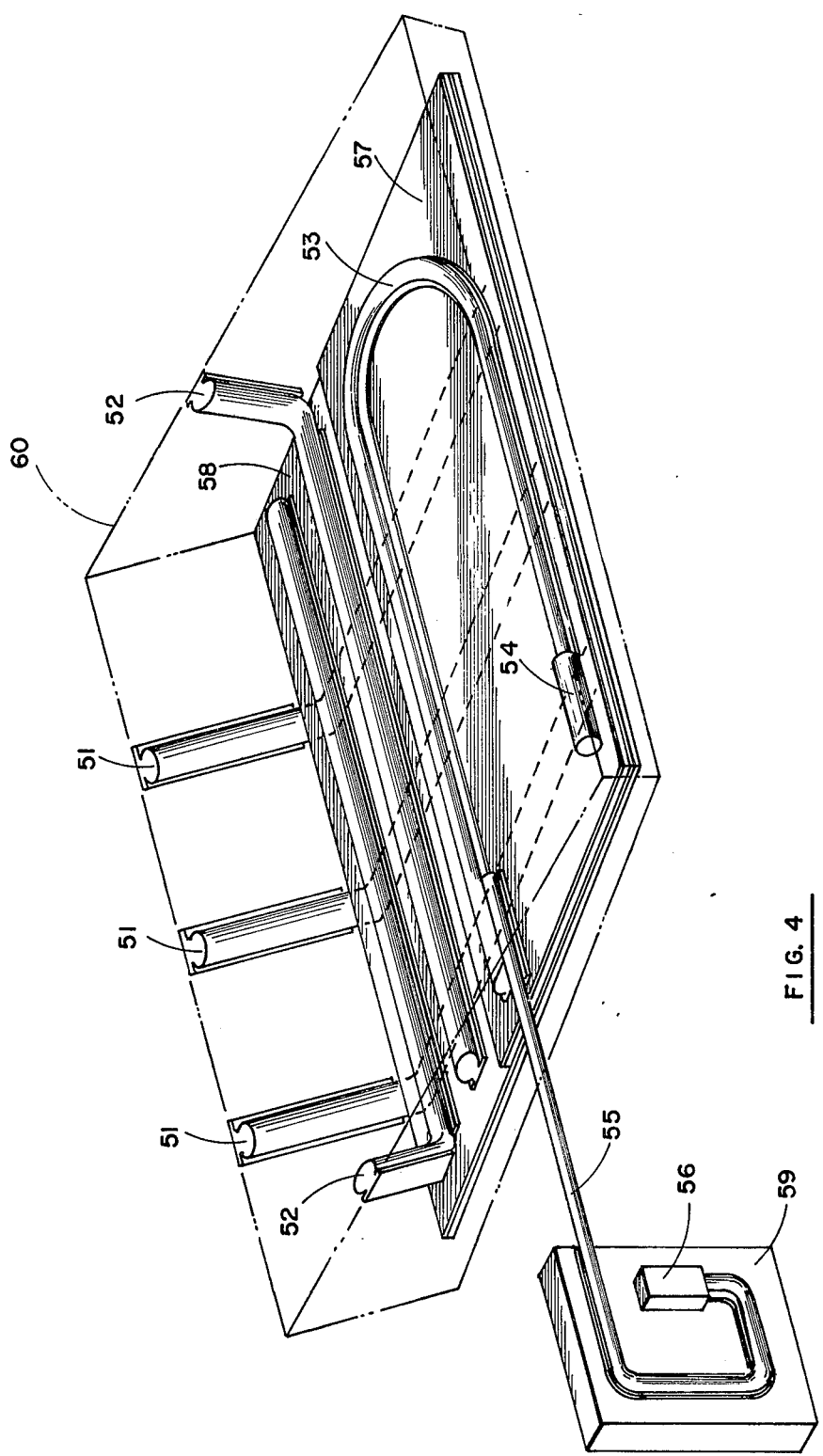
FIG. 4 illustrates a possible heat pipe layout for a typical two-stage radiator system.

Any number of heat pipes, combination of types, spacing or methods of application to a heat producing source can be used as part of this invention. A possible layout is shown in FIG. 4 by way of suggestion to describe possible configuration and performance of the multi-stage radiator system, but the invention is by no means limited to the layout or combination shown. The designer skilled in the art will determine the most appropriate for his intended usage.

In the embodiment of FIG. 1 the purpose of radiator 4 is to intercept and reject unwanted heat loads from the spacecraft conducted through boundary 1, supports 2 and insulation 3. Intermediate stage radiator 5 rejects heat transported by heat pipe 8 from an intermediate temperature sensor (not shown) or a sun shield (not shown), as well as any excess spacecraft heat not rejected by radiator 4 and conducted by supports 10 and multilayer insulation 7. By means of the action of the two inboard stages, cold stage radiator 6 is substantially less affected by spacecraft heat loads and is able to reject a correspondingly larger amount of the heat generated by the coldest sensor (not shown) from which heat is transported by heat pipe 9. As a result such sensor is kept at optimum cryogenic operating temperature.

In practice the multi-stage radiator system of this invention will probably be mounted in a sun shield designed to prevent at least the most outboard stage from seeing the sun during operational phases of the mission. The shield may be an integral part of the spacecraft or supported on an extensible boom or other deployment mechanism. One of the first considerations in the design of a radiator system is the effect of its orbital thermal environment resulting from exposure to the sun, earth or moon. This is particularly true of a cryogenic radiator whose temperature will be well below the earth's radiation temperature. For a radiator system operating at less than 100°K no solar exposure can be tolerated and earth exposure must be minimized. The surface area of environmental shields must also be minimized to prevent excessive reflected energy from affecting radiator performance and to maximize the radiators' view of deep space. Orbital altitude, orientation of the radiator surfaces to the orbital path, objectives of the particular mission and whether the orbit is sun synchronous or not will be determinative of the sun shield design. Although extremely favorable from a thermal control standpoint, a sun synchronous orbit may not be compatible with the objectives of the mission.

Figure 2:
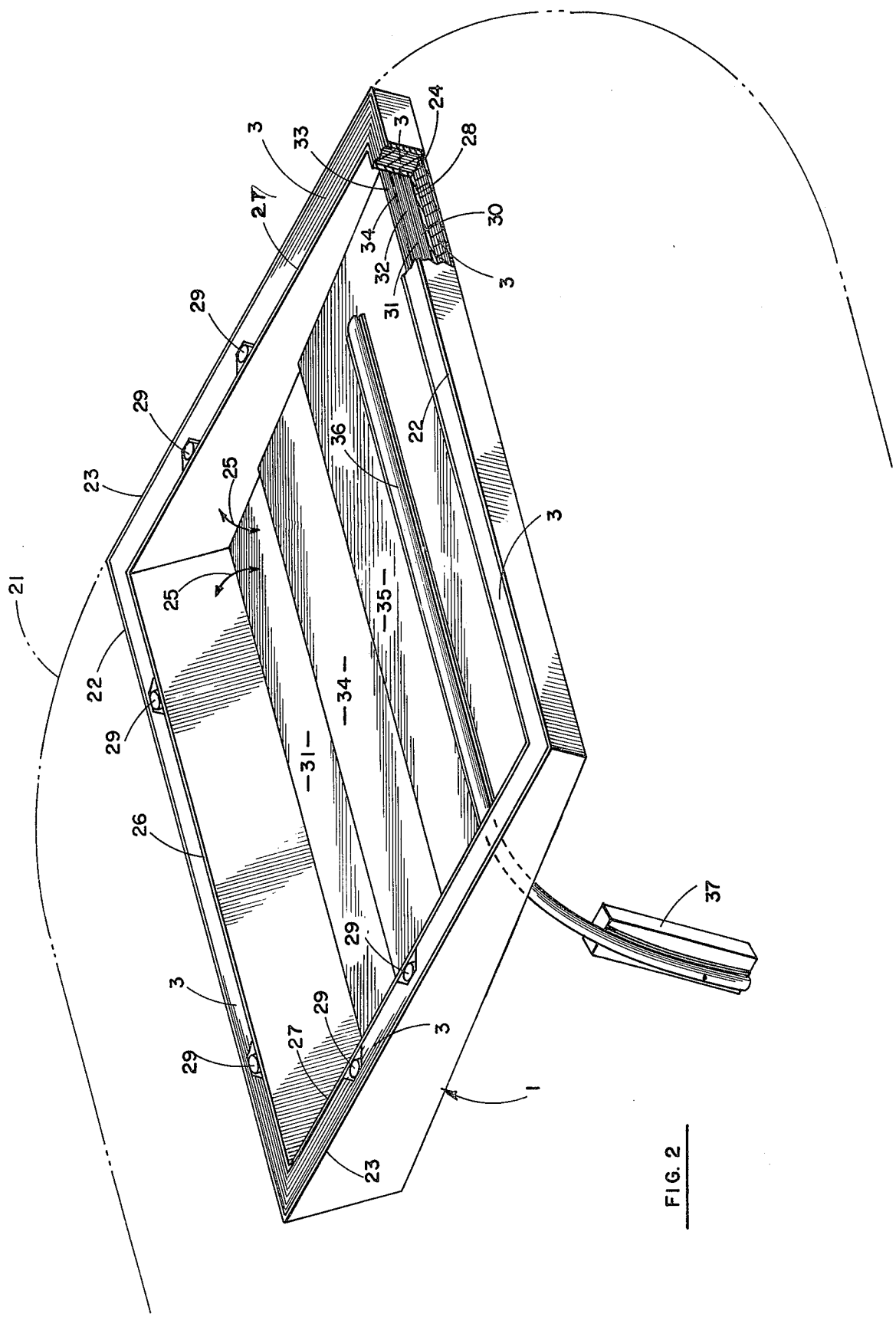
FIG. 2 is a partially cutaway view of a typical three stage cryogenic radiator system with sun shield.

FIG. 2 shows a typical three-stage cryogenic radiator system mounted within a pan-shaped sun shield. Numeral 1 is again the spacecraft boundary, where the system is integral with the spacecraft exterior mold line 21 shown in phantom. The boundary pan consists of end plates 22, side plates 23 and bottom 24. Insulation 3, preferably of the multilayer type, covers all interior surfaces of the boundary pan. Adhesives and fasteners are not shown in order to simplify the diagram and may be used individually or in combination as best suits the purpose of the designer. A sun shield pan is located in contact with insulation 3 and is generally configured to the same shape as the boundary pan. While sloped-away end and sides are not necessary in all cases, it will be desirable where every advantage must be obtained to maximize efficiency. The slope angle 25 is such that end shield 26 and side shields 27 will radiate absorbed heat away from the radiator stages. End shield 26 and side shields 27 have specular outboard surfaces such as gold fired on polished metal or vapor deposited on an organic material or glass fiber.

Heat pipes 29, shown in greater detail in FIG. 4, are located between insulation 3 and end and side shields 26 and 27 and are in thermal contact with said end and side shields. A blanket of multi-layer insulation 30 is disposed in the bottom 28 of the sun shield pan to thermally isolate the sun shield from first (warm) stage radiator 31. Second and third blankets of multilayer insulation 32 and 33, and second (intermediate) and third (cold) stage radiators (34) and (35) respectively are alternately stacked on top of radiator 31 in such manner that the exposed portion of radiator 31 is nearest end shield 26, the exposed portion of radiator 34 is further away from said end shield 26 and completely exposed radiator 35 is furthest away, within the confines of the sun shield pan. In this manner the second and third stages view less, successively, of the heat reflected or radiated from the end shield. The heat rejection ends of heat pipes 29 are thermally connected to intermediate radiator 34, and of heat pipe 36 to cold stage radiator 35. Heat pipe 36 transports heat from sensor 37, which is not part of this invention.

A two-stage radiator system may be similarly constructed, omitting intermediate stage radiator 34 and with warm stage radiator 31 rejecting heat both from pipes 29 and parasitic heat conducted through supports from boundary 1.

Of course, the sun shield itself may have two or more stages with each of the stages thermally connected to one or more warm or intermediate radiator stages. The number of stages of radiators is limited only by the operational requirements of the spacecraft and the payload size and weight limitations.

Figure 3:
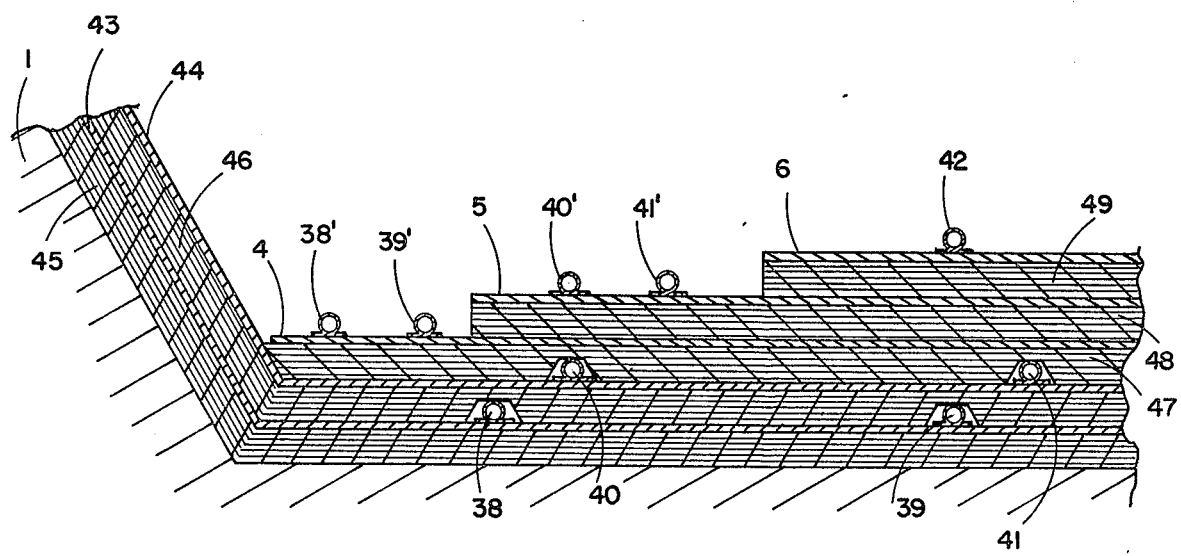
FIG. 3 is a cross-sectional view of a three-stage radiator system in a two-stage sun shield.

FIG. 3 is a cross-sectional view of the multi-stage radiator system of this invention used in conjunction with such a two-stage sun shield. The spacecraft boundary is again present as numeral 1. Sun shield stages 43 and 44 are thermally insulated from boundary 1 and from each other by insulation 45 and 46. Insulation blankets 47, 48, and 49 thermally isolate radiators 4, 5 and 6 from sun shield 44 and from each other. The heat absorption ends of heat pipes 38 and 39 are thermally attached to first stage sun shield 43 and terminate at their heat rejection ends 38' and 39' in thermal contact with the exposed portion of first stage radiator 4. Similarly, heat pipes 40 and 41 transport heat from the sun shield second stage 44 to intermediate radiator stage 5 at ends 40' and 41'. The heat rejection end of heat pipe 42 transports heat from a sensor (not shown) to cold stage radiator 6.

Heat pipes are the link in the combination of this invention, transporting heat from sensors, shield and structures for rejection by the radiator stages. FIG. 4 is a representative heat pipe layout for a twostage radiator to describe a possible combination of types and runs of heat pipes in an operational multi-stage radiator assembly. The scope of this invention is by no means limited to the layout therein and the designer skilled in the art will select such types and locate them in such manner as necessary to meet the requirements of his heat rejection problem.

In FIG. 4, insulation, supports and spacecraft boundary have been omitted for clarity and the final sun shield stage 60 is shown in phantom only to locate heat pipes and radiator stages in functional relationship. A network of heat pipes 51 and 52 are shown in thermal contact with the sun shield 60 structure to transport heat for rejection by warm stage radiator 58. Three heat pipes 51 are shown in contact with the end of shield 60, which views most of the sun on its exterior, and one heat pipe 52 is shown in contact with each side of shield 60. End shield heat pipes 51 are in thermal contact with the underside of warm stage radiator 58 between the multilayer insulation and the radiator, while side shield heat pipes 52 are in thermal contact with the top or exposed portion of radiator 58. The number, spacing and location of each for other embodiments will be determined by the size of the system and the amount of heat to be rejected.

Variable conductance heat pipe 53 is shown in thermal contact with the exposed side of cold stage radiator 57, with ethane as the working fluid and with the gas reservoir 54 containing argon as the control gas. The purpose of the variable conductance heat pipe is to accommodate fluctuations in temperature of the cold stage as orbital precession progresses. Diode heat pipe 55 transports heat from detector 59 and prevents reversal of the heat transfer process at such times as orbital conditions cause cold stage radiator 57 temperature to be greater than detector 59 temperature. Liquid trap 56 of the diode heat pipe is shown at detector 59. If the sun shield is deployable, a section of heat pipe 55 may be flexible to permit stowage of the system during launch. The design and operation of diode heat pipes and variable conductance heat pipes is well known in the art.

It will be observed that the invention provides a novel combination of passive elements to maintain sensors, detectors and other instruments at cryogenic temperatures for extended periods unattended under orbital conditions previously considered unacceptable.

The present invention, as described, is by way of illustration and may be subject to other modifications or embodiments all within the scope of the appended claims.

What is claimed is:

1. A cooling device for maintaining one or more heat producing sources at selected temperatures and comprising:
    a mounting surface;
    at least two superposed and spaced-apart radiation elements, each successively of lesser area than the next said radiation element closer to said mounting surface, and each adapted to radiate heat;
    at least one heat pipe in thermal conductivity with each of said radiation elements; and
    thermal insulation means in the space between said mounting surface and the radiation element closest to said mounting surface and between each two successive radiation elements to thermally isolate them from each other, whereby a portion of the surface facing away from said mounting surface of the larger in area of each two successive radiation elements is exposed to cooling temperature and the entire surface facing away from said mounting surface of the radiation element most remote from said mounting surface is exposed to cooling temperature.

2. The cooling device of claim 1, wherein said mounting surface is an uncovered shield comprising a base and at least one side substantially upright with respect to said radiation elements and of sufficient height to prevent direct exposure of the exposed portion of said radiation elements to sources of radiated heat external and unconnected to said cooling device.

3. The cooling device of claim 1, wherein said thermal insulation means is multi-layer, comprising a plurality of stacked, thin, polymeric film sheets with reflective surfaces, separated from each other by thermally non-conductive spacers.

4. The cooling device of claim 1, wherein said thermal insulation means is multi-layer, comprising a plurality of stacked, thin, polymeric film sheets with reflective surfaces separated in part from each other by protuberances embossed thereon.

5. A cooling device for maintaining one or more heat producing sources at selected temperatures and comprising:
    a mounting surface;
    at least two superposed and spaced-apart radiation elements, each successively of lesser area than the next said radiation element closer to said mounting surface, and each adapted to radiate heat;
    at least one heat pipe in thermal conductivity with each of said radiation elements except the radiation element closest to said mounting surface; and
    thermal insulation means in the space between said mounting surface and the radiation element closest to said mounting surface and between each two successive radiation elements to thermally isolate them from each other, whereby a portion of the surface facing away from said mounting surface of the larger in area of each two successive radiation elements is exposed to cooling temperature and the entire surface facing away from said mounting surface of the radiation element most remote from said mounting surface is exposed to cooling temperature.

6. The cooling device of claim 5, wherein said mounting surface is an uncovered shield comprising a base and at least one side substantially upright with respect to said radiation elements and of sufficient height to prevent direct exposure of the exposed portion of said radiation elements to sources of radiated heat external and unconnected to said cooling device.

7. The cooling device of claim 5, wherein said thermal insulation means is multi-layer, comprising a plurality of stacked, thin, polymeric film sheets with reflective surfaces, separated from each other by thermally non-conductive spacers.

8. The cooling device of claim 5, wherein said thermal insulation means is multi-layer, comprising a plurality of stacked, thin, polymeric film sheets with reflective surfaces separated in part from each other by protuberances embossed thereon.

* * * * *